US012640341B2

(12) United States Patent
Nomura et al.

(10) Patent No.: US 12,640,341 B2
(45) Date of Patent: May 26, 2026

(54) CHARGED PARTICLE BEAM WRITING METHOD AND CHARGED PARTICLE BEAM WRITING APPARATUS

(71) Applicant: NuFlare Technology, Inc., Yokohama (JP)

(72) Inventors: Haruyuki Nomura, Yokohama (JP); Noriaki Nakayamada, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 553 days.

(21) Appl. No.: 17/956,021

(22) Filed: Sep. 29, 2022

(65) Prior Publication Data

US 2023/0029715 A1     Feb. 2, 2023

Related U.S. Application Data

(63) Continuation of application No. PCT/JP2021/013329, filed on Mar. 29, 2021.

(30) Foreign Application Priority Data

Apr. 27, 2020     (JP) ................................. 2020-078344

(51) Int. Cl.
*H01J 37/302* (2006.01)
*H01J 37/317* (2006.01)

(52) U.S. Cl.
CPC ...... *H01J 37/3174* (2013.01); *H01J 37/3026* (2013.01); *H01J 2237/3045* (2013.01); *H01J 2237/30461* (2013.01)

(58) Field of Classification Search
None
See application file for complete search history.

(56) References Cited

U.S. PATENT DOCUMENTS 5,912,468 A     6/1999   Hirano et al.
7,652,271 B2    1/2010   Wake et al.
(Continued)

FOREIGN PATENT DOCUMENTS

JP         61-142740 A     6/1986
JP         10-027753 A     1/1998
(Continued)

OTHER PUBLICATIONS

Korean Office Action issued Apr. 16, 2024 in Korean Patent Application No. 10-2022-7015027 (with unedited computer-generated English Translation), 7 pages.
(Continued)

*Primary Examiner* — James Choi
(74) *Attorney, Agent, or Firm* — Oblon, McClelland, Maier & Neustadt, L.L.P.

(57) ABSTRACT

An amount of charge of a substrate is promptly and accurately calculated. A charged particle beam writing method includes a step for virtually dividing a writing region of the writing target substrate in a mesh-like manner and calculating a pattern density representing an arrangement ratio of the pattern for each mesh region, a step for calculating a dose for each mesh region using the pattern density, a step for calculating a charge amount based on a film thickness of the resist film formed on the substrate and the calculated dose by using a predetermined function for charge amount calculation, the function using, as variables, the film thickness of the resist film and the dose, a step for calculating a position shift amount of a writing position from the calculated charge amount, and a step for correcting an irradiation position of the charged particle beam using the position shift amount.

6 Claims, 6 Drawing Sheets

(56) References Cited

U.S. PATENT DOCUMENTS

| | | | |
|---|---|---|---|
| 8,129,698 B2 | 3/2012 | Nakayamada et al. | |
| 8,178,856 B2 | 5/2012 | Nakayamada et al. | |
| 10,236,160 B2 | 3/2019 | Nakayamada | |
| 10,410,830 B2 | 9/2019 | Nakayamada | |
| 10,950,413 B2 | 3/2021 | Nakayamada | |
| 2008/0067441 A1* | 3/2008 | Wake .................. | H01J 37/3174 |
| | | | 250/492.21 |
| 2008/0179517 A1* | 7/2008 | Kawada ................. | H01J 37/28 |
| | | | 250/311 |
| 2011/0121208 A1* | 5/2011 | Nakayamada ...... | H01J 37/3174 |
| | | | 250/492.22 |
| 2013/0032707 A1 | 2/2013 | Nakayamada et al. | |
| 2014/0322833 A1* | 10/2014 | Yamaguchi ......... | H01J 37/3045 |
| | | | 250/398 |
| 2021/0241995 A1 | 8/2021 | Nomura et al. | |

FOREIGN PATENT DOCUMENTS

| | | | |
|---|---|---|---|
| JP | 11-054077 A | 2/1999 | |
| JP | 11-312634 A | 11/1999 | |
| JP | 2002-158167 A | 5/2002 | |
| JP | 2007-324175 A | 12/2007 | |
| JP | 2010-153456 A | 7/2010 | |
| JP | 2011-108968 A | 6/2011 | |
| JP | 5063035 B2 | 10/2012 | |
| JP | 5480496 B2 | 4/2014 | |
| JP | 5480555 B2 | 4/2014 | |
| JP | 2018-133552 A | 8/2018 | |
| JP | 2018-133553 A | 8/2018 | |
| JP | 2021-180224 A | 11/2021 | |
| JP | 7026575 B2 | 2/2022 | |
| WO | WO 2020/095743 A1 | 5/2020 | |
| WO | WO 2021/229966 A1 | 11/2021 | |

OTHER PUBLICATIONS

International Search Report issued Jun. 8, 2021 in PCT/JP2021/013329 filed on Mar. 29, 2021, 2 pages.

Taiwanese Office Action issued May 16, 2022 in Taiwanese Patent Application No. 110112506, 6 pages (with English Machine Translation).

Japanese Office Action issued on Jul. 25, 2023 in Japanese Patent Application No. 2022-517565 (with unedited computer-generated English translation), 6 pages.

Office Action issued Apr. 11, 2023, in corresponding Japanese Patent Application No. 2022-517565 (with English Translation), 6 pages.

* cited by examiner

FIG.4a
FIG.4b
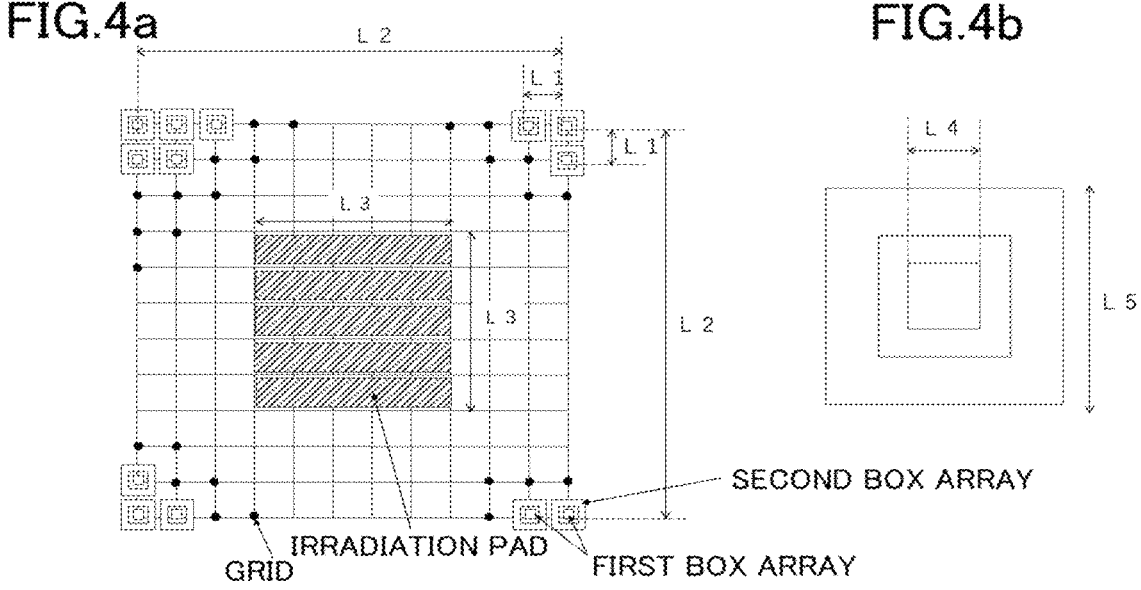
GRID     IRRADIATION PAD     FIRST BOX ARRAY
SECOND BOX ARRAY
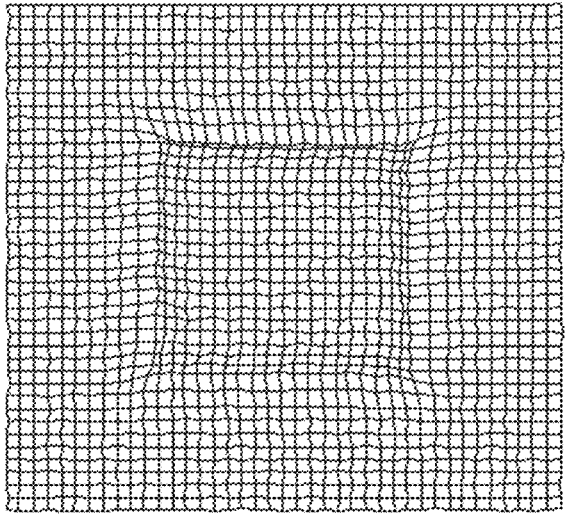
FIG.5

CORRELATION FITTING
BETWEEN P1 AND P0

CORRELATION FITTING
BETWEEN P2 AND P0

CHARGED PARTICLE BEAM WRITING METHOD AND CHARGED PARTICLE BEAM WRITING APPARATUS

TECHNICAL FIELD

The present invention relates to a charged particle beam writing method and a charged particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In a case where a substrate such as a mask is irradiated with an electron beam, an irradiation position and its surrounding region are charged by electron beam irradiation performed in the past, and the irradiation position is shifted. Hitherto, as a method for eliminating this beam irradiation position shift, a method is known in which the surface of a substrate is prevented from being charged by forming an antistatic film (a charge dissipation layer (CDL)) on the substrate. However, this antistatic film basically has acid characteristics and thus is not suitable for, for example, a case where a chemically amplified resist is applied onto the substrate. Moreover, new facilities need to be provided to form an antistatic film, thereby further increasing the manufacturing cost. Therefore, it is desired that charging effect correction (CEC) be performed without using an antistatic film.

Hitherto, in charging effect correction, the dependence of a charge amount on a beam irradiation amount has been obtained from a writing evaluation performed on a substrate basis. Thus, in order to estimate the amount of charge of a substrate, every time the thickness of the resist film is changed or the concentration of an acid generating agent, for example, included in the resist is changed, it is necessary to write an evaluation pattern and evaluate the writing result, and this is troublesome. Moreover, the downtime of the apparatus has become longer.

PTL 1: JP2002-158167A
PTL 2: JPH10-027753A
PTL 3: JPS61-142740A
PTL 4: JP5480555B2
PTL 5: JP5480496B2

SUMMARY OF INVENTION

The present invention aims to provide a charged particle beam writing method and a charged particle beam writing apparatus that can promptly and accurately calculate the amount of charge of a substrate.

According to one aspect of the present invention, a charged particle beam writing method in which a deflector is caused to deflect a charged particle beam and a pattern is written by irradiating, with the charged particle beam, a substrate in which a resist film is formed, includes virtually dividing a writing region of the substrate in a mesh-like manner and calculating a pattern density representing an arrangement ratio of the pattern for each mesh region, calculating a dose for each mesh region using the pattern density, calculating a charge amount based on a film thickness of the resist film formed in the substrate and the calculated dose by using a predetermined function for charge amount calculation, the function using, as variables, the film thickness of the resist film and the dose, calculating a position shift amount of a writing position from the calculated charge amount, and correcting an irradiation position of the charged particle beam using the position shift amount.

According to one aspect of the present invention, a charged particle beam writing apparatus in which a deflector is caused to deflect a charged particle beam and a pattern is written by irradiating, with the charged particle beam, a substrate in which a resist film is formed, includes an emitter emitting the charged particle beam, a pattern density calculator virtually dividing a writing region of the substrate in a mesh-like manner and calculating a pattern density representing an arrangement ratio of the pattern for each mesh region, a dose calculator calculating a dose representing a dose for each mesh region using the pattern density, a storage storing a function for charge amount calculation, the function using, as variables, a film thickness of the resist film and the dose, a charge amount calculator retrieving the function from the storage unit, using the function, and calculating a charge amount based on the film thickness of the resist film formed in the substrate and the dose calculated by the dose calculator, a position shift amount calculator calculating a position shift amount of a writing position from the charge amount, a corrector correcting, using the position shift amount, an irradiation position of the charged particle beam, and a writer irradiating the corrected irradiation position with the charged particle beam.

Advantageous Effects of Invention

According to the present invention, the amount of charge of a substrate can be promptly and accurately calculated.

BRIEF DESCRIPTION OF DRAWINGS

FIG. 4a is a diagram illustrating a test layout used to measure resist charging effect, and FIG. 4b is a schematic diagram of a box array.

FIG. 5 is a diagram illustrating an example of a position shift amount distribution obtained by evaluating the test layout.

DESCRIPTION OF EMBODIMENTS

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
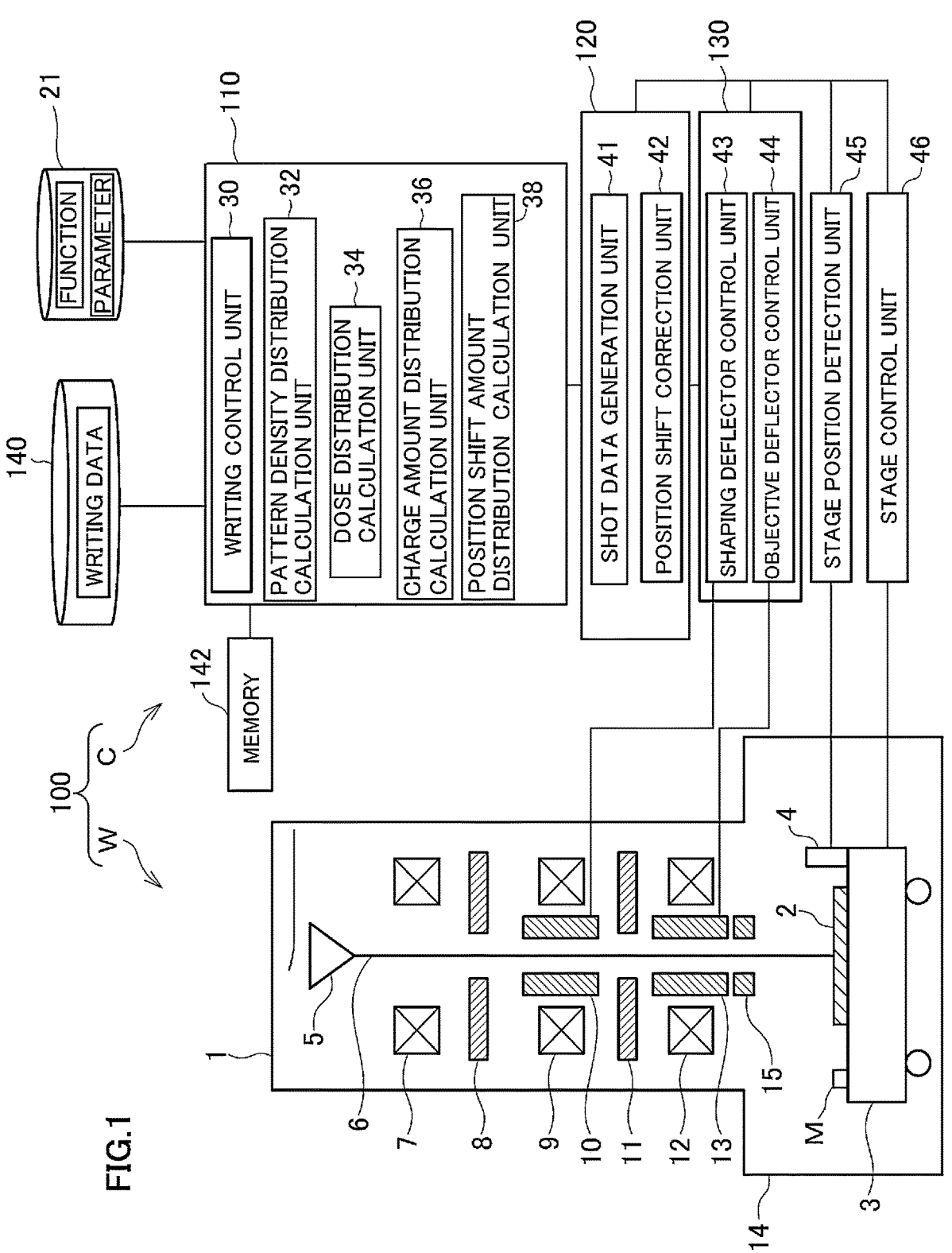
FIG. 1 is a schematic diagram of a writing apparatus according to an embodiment of the present invention.

FIG. 1 is a schematic configuration diagram of a writing apparatus according to an embodiment. A writing apparatus 100 illustrated in FIG. 1 includes a writing unit W and a control unit C. The writing apparatus 100 is an example of an electron beam writing apparatus. The writing unit W has an electric column 1 and a writing space 14. In the electronic column 1, an electron gun 5, an illumination lens 7, a first aperture plate 8, a projection lens 9, a shaping deflector 10, a second aperture plate 11, an objective lens 12, an objective deflector 13, and an electrostatic lens 15 are arranged.

In the writing space 14, an XY stage 3 is arranged. A substrate 2, which is a writing target, is arranged on the XY stage 3. The substrate 2 includes, for example, a photomask used for exposure in semiconductor manufacturing and a semiconductor wafer for forming a semiconductor device. In addition, a photomask on which writing is to be performed includes a mask blank, on which nothing has been written yet. For example, the substrate 2 has quartz, a chromium film provided on the quartz, and a resist layer provided on the chromium film. On the XY stage 3, a mirror 4 for stage position measurement is arranged at a different position from the position where the substrate 2 is arranged.

On the XY stage 3, a mark M for calibration is provided at a different position from the position where the substrate 2 is arranged. For example, the mark M is made of metal and has a cross shape. Focus adjustment, position adjustment, deflection shape correction coefficient adjustment, and the like are performed by scanning the mark M using an electron beam and detecting reflected electrons from the mark M using a detector (not illustrated).

The control unit C has, for example, control calculators 110 and 120, a stage position detection unit 45, a stage control unit 46, a deflection control circuit 130, a memory 142, and storage devices 21 and 140 such as a magnetic disk device. The deflection control circuit 130 is connected to the shaping deflector 10 and the objective deflector 13.

The control calculator 110 has the functions of a writing control unit 30, a pattern density distribution calculation unit 32, a dose distribution calculation unit 34, a charge amount distribution calculation unit 36, and a position shift amount distribution calculation unit 38. The writing control unit 30 controls the entirety of the apparatus. Each unit of the control calculator 110 may be configured using hardware including, for example, an electric circuit, a computer, a processor, a circuit board, a quantum circuit, or a semiconductor device or may be configured using software. Data input to and calculation results from each unit of the control calculator 110 are stored in the memory 142.

The control calculator 120 has the functions of a shot data generation unit 41 and a position shift correction unit 42. The shot data generation unit 41 and the position shift correction unit 42 may be configured using software or hardware.

The deflection control circuit 130 has the functions of a shaping deflector control unit 43 and an objective deflector control unit 44. The shaping deflector control unit 43 and the objective deflector control unit 44 may be configured using software or hardware.

Writing data (layout data) in which a plurality of shape patterns to be written are defined is stored in the storage device 140.

An electron beam 6 emitted from the electron gun 5 (an emission unit) is caused to illuminate the entirety of the first aperture plate 8, which has a rectangular hole, by the illumination lens 7. In this case, first, the electron beam 6 is shaped so as to have a rectangular shape. The electron beam 6 of a first aperture image that has passed through the first aperture plate 8 is projected onto the second aperture plate 11 by the projection lens 9. The position of the first aperture image on the second aperture plate 11 is deflected by the shaping deflector 10 controlled by the shaping deflector control unit 43, so that the beam shape and size can be changed (variable shaping).

The electron beam 6 of a second aperture image that has passed through the second aperture plate 11 is focused by the objective lens 12, deflected by, for example, an electrostatic deflector (the objective deflector 13) controlled by the objective deflector control unit 44, and applied to a desired position on the substrate 2 on the XY stage 3, which is arranged so as to be movable. The XY stage 3 is driven and controlled by the stage control unit 46. The position of the XY stage 3 is detected by the stage position detection unit 45. The stage position detection unit 45 includes, for example, a laser length measurement device that irradiates the mirror 4 with laser to measure the position on the basis of the interference between incident light and reflected light. The electrostatic lens 15 dynamically corrects the focus position of the electron beam 6 in accordance with the roughness of the surface of the substrate 2 (dynamic focus).

Figure 2:
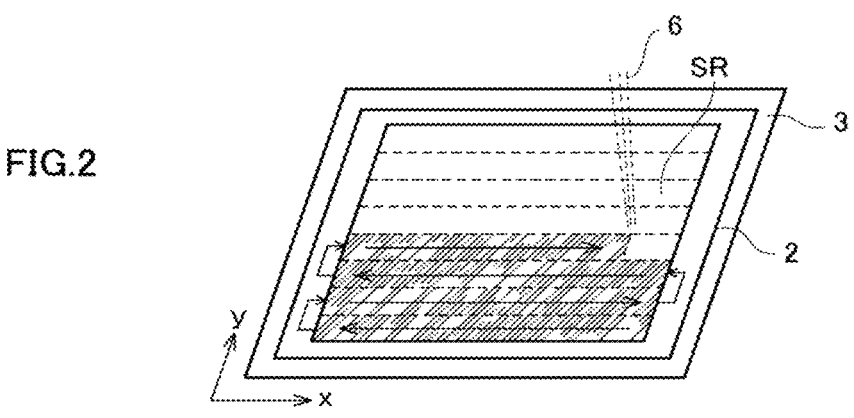
FIG. 2 is a diagram for describing the way in which a stage is moved.

FIG. 2 is a diagram for describing the way in which the stage is moved. In a case where writing is performed on the substrate 2, the XY stage 3 is continuously moved, for example, in the X direction. A writing region is virtually divided into a plurality of strip-shaped stripe regions (SR) having a width across which the electron beam 6 can be deflected. Writing processing is performed in units of stripe region. The XY stage 3 is, for example, continuously moved in the X direction, and the shot position of the electron beam 6 is simultaneously caused to track the stage movement. By causing the XY stage 3 to move continuously, a writing time can be shortened.

After writing in one stripe region is finished, the XY stage 3 is step fed in the Y direction, and a writing operation is performed in the next stripe region in the X direction (the opposite direction). The travel time of the XY stage 3 can be shortened by performing the writing operation on the individual stripe regions in a meandering manner.

In the writing apparatus 100, in order to process layout data (writing data), the writing region is virtually divided into a plurality of strip-shaped frame regions, and data processing is performed on a frame region basis. In a case where multiple exposures are not performed, normally, the frame regions are the same as the stripe regions. In a case where multiple exposures are performed, the frame regions and the stripe regions become misaligned in accordance with the number of exposures. In this manner, the writing region of the substrate 2 is virtually divided into the plurality of frame regions (stripe regions), which are a plurality of writing unit regions, and the writing unit W performs writing on a frame region (stripe region) basis.

It is known that when the resist layer of the substrate 2 is irradiated with an electron beam, the beam irradiation position is shifted due to resist charging effect. In the present embodiment, a function $\sigma(d, D_{exp})$, which can calculate the amount of charge of the surface of the substrate (the total charge amount per unit area=charge density), is obtained in advance and stored in the storage device 21. The function $\sigma(d, D_{exp})$ uses, as variables, a resist film thickness d and a dose $D_{exp}$ of an electron beam with which irradiation is to be performed and is determined by a group of parameters representing physical characteristics of the resist. When writing is performed, a position shift amount of the electron beam on the substrate 2 is calculated on the basis of the charge amount calculated from this function $\sigma(d, D_{exp})$, and the beam irradiation position is corrected.

The way in which the function $\sigma(d, D_{exp})$ is obtained will be described.

In a case where, regarding the substrate, a pattern density is denoted by p, a back-scattering coefficient is denoted by $\eta$, and a reference dose (a dose at the time when the pattern density is 100%) is denoted by $D_{100}$, a proximity effect corrected dose $D_{exp}$ is expressed as the following Eq. (1).

$$D_{exp}=D_{100}*\{(\tfrac{1}{2}+\eta)/(\tfrac{1}{2}+\eta*p)\} \tag{1}$$

The number of electrons incident on the resist per unit area is denoted by $n_p$ and expressed as the following Eq. (2) using an elementary charge e.

$$n_p=D_{exp}*p/e \tag{2}$$

Figure 3A:
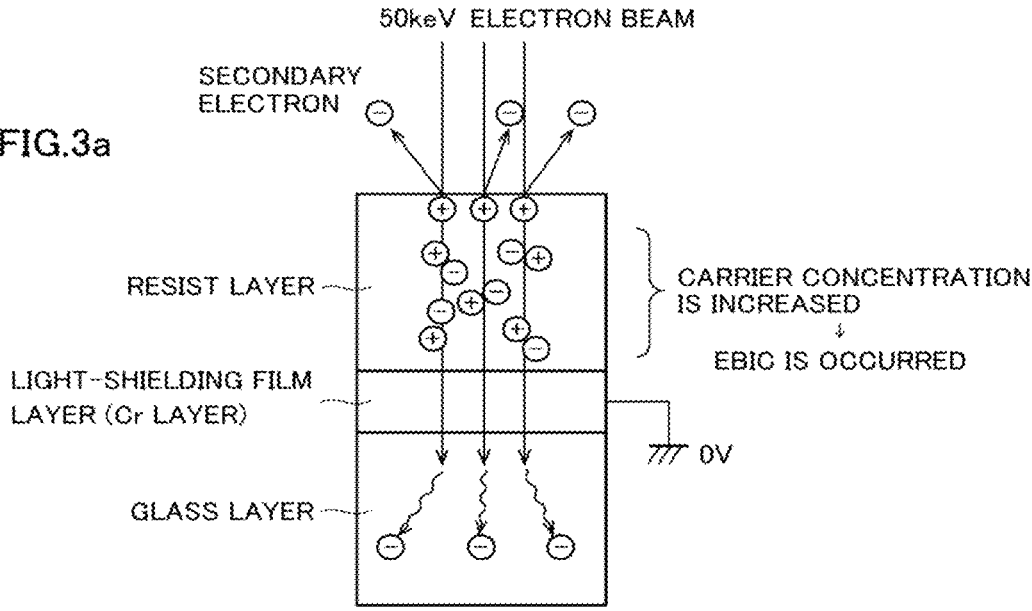
FIG. 3a is a schematic diagram illustrating ionization in a resist layer.

In this case, in a case where the energy of an incident electron beam is high (for example, 50 keV), as illustrated in FIG. 3a, almost all of the incident electrons penetrate through the resist layer and a light-shielding film layer (for example, Cr) and are accumulated in a glass layer. In electron beam lithography, generally, the light-shielding film layer is maintained at a ground potential (0 V), and thus the electric field created by these incident electrons is blocked by the light-shielding film layer and does not contribute to resist charging effect. In contrast, when the incident electrons pass through the resist layer, ionization occurs in the resist layer through the interaction between the incident electrons and substances of which the resist is made. In a case where ionization has occurred near the surface of the resist, some of the electrons generated by ionization fly out toward the writing space and become secondary electrons, and holes are generated at the places where the electrons were originally present. In this case, the probability of occurrence of a secondary electron-hole pair with respect to one incident electron (a secondary electron yield) is denoted by $\alpha$.

In a case where ionization has occurred inside the resist, a plurality of generated electron-hole pairs are oriented in random directions as illustrated in FIG. 3a, and electric fields caused by these pairs cancel each other out. Thus, the charge of these pairs does not contribute to resist charging. However, the carrier concentration in the resist increases, and thus the phenomenon of electron beam induced conductivity is exhibited, which will be described later. Since electron-hole pairs recombine with each other and disappear immediately after being generated, electrical conduction occurs only during beam irradiation and ends when the beam irradiation is finished.

Suppose that holes (positive holes) the number of which is equal to the number of generated secondary electrons are denoted by $n_{SE}$ and are supplied to the surface of the resist. When $n_p$ electrons are incident on the resist, the number of holes, which is denoted by $n_h$, generated on the surface of the resist is expressed as the following Eq. (3).

$$n_h=n_{SE}=n_p*\alpha \tag{3}$$

Figure 3B:
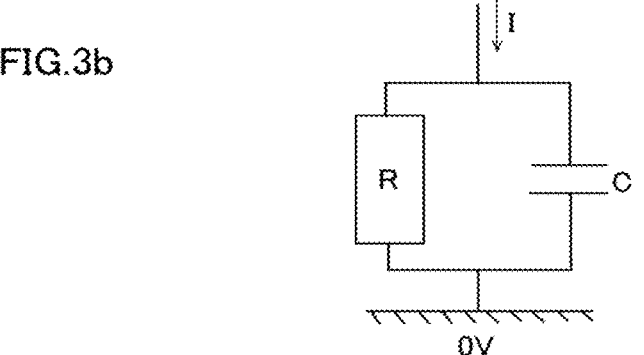
FIG. 3b is a diagram illustrating an equivalent circuit that simulates a resist film.

Next, holes accumulated on the surface of the resist will be considered. In a case where electrical conduction occurs inside the resist due to the electron beam induced conductivity (EBIC) effect, the resist layer can be regarded as an equivalent circuit (an RC circuit) as illustrated in FIG. 3b, and the amount of charge accumulated in the capacitor of the equivalent circuit becomes equal to the amount of charge accumulated on the surface of the resist. This amount of charge is denoted by Q(t) and can be expressed as Eq. (4), which is about charging of a general RC circuit. In Eq. (4), t represents electron beam irradiation time, C represents capacitance per unit area of the resist, and R represents conductivity that occurs due to the EBIC effect only at the time of beam irradiation. I represents charge to be supplied per unit time and can be regarded as holes supplied by departure of secondary electrons from the resist.

$$Q(t)=RCI\{1-\exp(-t/RC)\} \tag{4}$$

When considered per unit area, the charge I can be replaced as in the following Eq. (5) using a current density J of an incident electron beam.

$$I=\alpha J \tag{5}$$

As described above, the equivalent circuit is completed due to the EBIC effect only at the time of beam irradiation, and thus t in Eq. (4) can be replaced with an irradiation time by using an equation represented by the following Eq. (6).

$$t=en_p/J \tag{6}$$

Thus, the total amount of charge of the positive holes at the time when $n_p$ electrons are incident on the resist is expressed as the following Eq. (7).

$$Q(n_p)=\alpha JRC\{1-\exp(-en_p/JRC)\} \tag{7}$$

The number of holes accumulated on the surface of the resist is denoted by $n_{rh}$ and can be calculated by dividing $Q(n_p)$ by the elementary charge e. Thus, $n_{rh}$ is expressed as the following Eq. (8). Moreover, when the permittivity of the resist is denoted by F, the thickness of the resist is denoted by d, and the resistivity of the resist during beam irradiation is denoted by $\rho$, $C=\varepsilon/d$, and $R=\rho d$, and thus $RC=\rho\varepsilon$ can be obtained as a replacement.

$$n_{rh}=\alpha JRC\{1-\exp(-en_p/JRC)\}/e=\alpha J\rho\varepsilon\{1-\exp(-en_p/J\rho\varepsilon)\}/e \tag{8}$$

Among the secondary electrons generated by electron beam irradiation, secondary electrons having energies of less than or equal to a surface potential Vs of the resist are pulled back to the resist and contribute to charging. Thus, the number of secondary electrons that accumulate on the surface of the resist is denoted by $n_{rSE}$ and needs to be taken into consideration. In a case where the number of secondary electrons generated when the number of irradiation electrons are increased by $dn_p$ are denoted by $dn_{SE}$, an increase in the number of secondary electrons that accumulate in the resist is denoted by $dn_{rSE}$ and is expressed as the following Eq. (9). P(E) in Eq. (9) refers to the probability of occurrence of secondary electrons having energies E (a spectrum) and is expressed as the following Eq. (10).

$$dn_{rSE} = \int_0^{V_s} dn_{SE} * P(E)dE \tag{9}$$

$$= \alpha * dn_p * \int_0^{V_s} P(E)dE$$

$$\therefore \frac{dn_{rSE}}{dn_p} = \alpha \int_0^{V_s} P(E)dE$$

$$\int_0^{\infty} P(E)dE = 1 \tag{10}$$

The surface potential Vs of the resist can be expressed as the following Eq. (11) using the amount of charge of the surface of the resist and the capacitance of the resist.

$$Vs=e(n_{rh}-n_{rSE})/C \tag{11}$$

By substituting Eq. (9) into Eq. (11) and performing replacement using C=ε/d, the following Eq. (12) can be acquired as a differential equation.

$$\frac{dn_{rSE}}{dn_p} = \alpha \int_0^{\frac{e(n_{rh}-n_{rSE})d}{\varepsilon}} P(E)dE \tag{12}$$

It is known that the standardized secondary electron emission spectrum P(E) can be expressed as the following Eq. (13) (B. L. Henke, et. al., Journal of Applied Physics 48, 1852(1977); "0.1-10-keV x-ray-induced electron emissions from solids-Models and secondary electron measurements".). In Eq. (13), W is a work function for the resist.

$$P(E)=2W^2E/(E+W)^4 \tag{13}$$

In writing in which a charging effect correction is performed, it is known that writing can be performed with higher accuracy by taking the amount of attenuation of charge into consideration (for example, JP5480555B2). Thus, it is desirable that the amount of charge after attenuation has occurred be obtained after a sufficient time has elapsed after performance of writing. In this case, it is considered that, among the holes accumulated in the resist, holes near the chromium film move into the chromium film, which is a layer under the resist, and attenuation is caused. Thus, suppose that holes within a certain distance from the chromium film move into the chromium film regardless of the pattern density, and the number of accumulated holes decreases. The number of accumulated holes after attenuation has occurred is denoted by $n_{rh(static)}$ and can be expressed as the following Eq. (14). In Eq. (14), $\beta$ represents the residual rate of holes after attenuation has occurred.

$$n_{rh(static)}=\beta n_{rh} \tag{14}$$

Note that secondary electrons accumulate on the surface of the resist, which is far from the chromium film, and thus it is considered that the secondary electrons will not attenuate.

The function $\sigma(d, D_{exp})$ is expressed as the following Eq. (15). This is obtained by using Eqs. (2), (8), (12), (13), and (14) described above. As a group of parameters representing physical characteristics of the resist, the secondary electron yield $\alpha$, the permittivity $\varepsilon$ of the resist, the resistivity $\rho$ of the resist during beam irradiation, the work function W for the resist, and the residual rate $\beta$ of holes after attenuation has occurred are determined, so that the function $\sigma(d, D_{exp})$ is a function using, as variables, the film thickness d of the resist and the dose $D_{exp}$. The secondary electron yield $\alpha$, the permittivity $\varepsilon$, the resistivity $\rho$, the work function W, and the residual rate $\beta$ can be determined by fitting the function $\sigma(d, D_{exp})$ to experimental results regarding the relationship between the per-unit irradiation amount and the per-unit charge amount of a substrate having at least one kind of film thickness, the relationship being obtained in advance by evaluating writing.

$$\sigma(d, D_{exp}) = \begin{cases} (n_{rh} - n_{rSE}) * e & \text{immediately after writing} \\ (n_{rh(static)} - n_{rSE}) * e & \text{after attenuation} \end{cases} \tag{15}$$

Substrates (mask blanks) provided with the following four kinds of resist A to D having different film thicknesses or dose sensitivities were prepared. Regarding the relationship between dose and charge amount, results obtained by evaluating writing were compared with calculation results obtained using the function $\sigma(d, D_{exp})$.

Resist A: Film Thickness 300 nm, Dose Sensitivity~7 $\mu C/cm^2$

Resist B: Film Thickness 165 nm, Dose Sensitivity~23 $\mu C/cm^2$

Resist C: Film Thickness 80 nm, Dose Sensitivity~60 $\mu C/cm^2$

Resist D: Film Thickness 80 nm, Dose Sensitivity~100 $\mu C/cm^2$

The following numerical values were used for the parameters of the function $\sigma(d, D_{exp})$.

$\alpha=0.036$ $\rho=13.6$ [$\Omega m$]

$\beta=0.65$ $\varepsilon=3.1*\varepsilon_0$ (a relative permittivity of 3.1, $\varepsilon_0$: vacuum permittivity)

$W=3.0$ [eV]

The amount of charge of the resist at the time of electron beam irradiation (the amount of charge per unit area) can be measured by evaluating writing as below using a method similar to that disclosed in an embodiment of, for example, JP5480555B2. FIG. 4a is a diagram illustrating a test layout used to measure resist charging effect. Note that FIG. 4a is illustrated at different scales in order to clearly illustrate the details of the individual units.

Regarding a test layout TL illustrated in FIG. 4a, an irradiation pad with sides having a length of L3, which is 10 mm, and having a pattern density p is written with a dose $D_{exp}$ in the center of the layout TL. Immediately after the irradiation pad has been written, a first box array is written in which the boxes are provided with a pitch L1, which is 200 $\mu$m, and on a grid (81×81 grid points) with sides having a length of L1, which is 20 mm. Thereafter, furthermore, after a sufficient time has elapsed since the irradiation pad was written (for example, after 10 minutes), a second box array is written on the same grid for the first box array. As a result, the test layout TL can be obtained.

As illustrated in FIG. 4b in an enlarged manner, the first box array has, for example a pattern formed by squares each with sides having a length of L4, which is 4 $\mu$m. The second box array has, for example, a pattern formed by frame-like shapes each with sides having a length of L5, which is 14 $\mu$m, having a size greater than that of the first box array, and having a hollow in the center.

In this manner, the distributions of position shift amounts from design positions due to the charging effect of the irradiation pad are denoted by $P_1$ and $P_2$ and obtained by measuring the positions of the written first and second box arrays. $P_1$ can be used to evaluate the amount of charge obtained immediately after performance of irradiation because $P_1$ is written immediately after the irradiation pad has been charged. $P_2$ can be used to evaluate the amount of charge obtained after attenuation has occurred because $P_2$ is written after a sufficient time has elapsed since the irradiation pad was charged.

FIG. 5 is an example of a position shift amount distribution obtained by evaluating such a test layout.

Using a response function r(x, y) assumed to calculate position shift amounts from a charge amount distribution, charge amounts can be obtained from the distribution of position shift amounts as in the following. First, the distribution of position shift amounts $P_0$ is for a case where it is assumed that the irradiation pad is uniformly charged so as to have 1 $nC/cm^2$, and the distribution of position shift amounts $P_0$ is obtained by convolving a function $C_0(x, y)$, which gives 1 nC/cm² for the region of the irradiation pad and 0 for the region outside the irradiation pad, and the response function r(x, y) with each other as in the following Eq. (16).

$$P_0(x, y) = \int_{-\infty}^{\infty} dx' \int_{-\infty}^{\infty} dy' C_0(x', y') * r(x - x', x - y') = \qquad (16)$$

$$\int \int_{irradiation\ pad\ region} 1 \cdot r(x - x', y - y') dx' dy'$$

Figures 6, 7A, 7B:
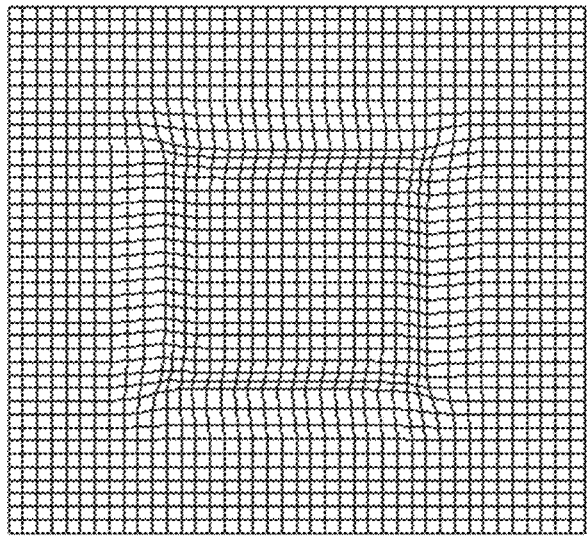
FIG. 6 is a diagram illustrating an example of a position shift amount distribution calculated from an equation.
FIGS. 7a and 7b are graphs representing the correlation between position shift amount distributions.
Figure 8A:
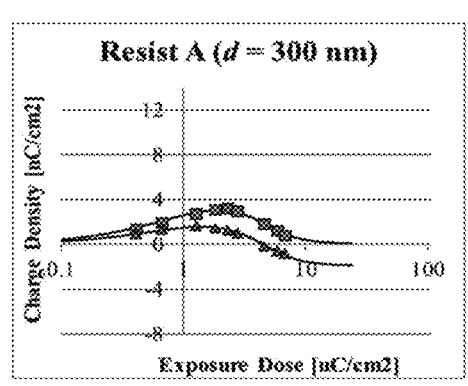
FIGS. 8a to 8d are graphs for comparing writing evaluation results with function calculation results.
Figure 8B:
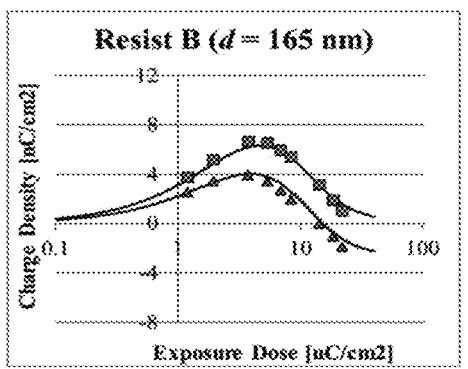
Figure 8C:
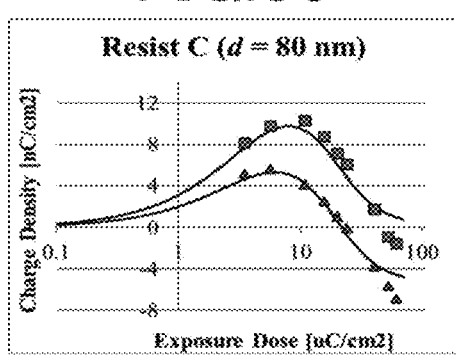
Figure 8D:
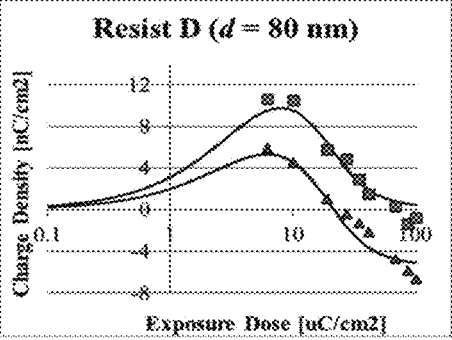

FIG. 6 illustrates the distribution of position shift amounts $P_0$ obtained using the equation above.

The amount of charge of the irradiation pad can be calculated from gradients obtained by correlating $P_0$ and each of the measurement results $P_1$ and $P_2$.

FIGS. 7a and 7b are graphs representing the correlations between each of $P_1$ and $P_2$ and $P_0$ in a case where the irradiation pad having a pattern density of 25% was irradiated with a dose of 23 μC/cm². As a result of linear approximation of each of these correlations, gradients of 1.57 and 0.75 are obtained. This represents that the position shift amounts of $P_1$ and $P_2$ are substantially equivalent to position shift amounts obtained by multiplying a model in which the irradiation pad was charged so as to have 1 nC/cm² by 1.57 and 0.75. Thus, it is clear that the irradiation pad is charged so as to have 1.57 nC/cm² and 0.75 nC/cm² for respective cases.

Comparison results between the results obtained by evaluating writing and calculation results obtained using the function σ(d, $D_{exp}$) will be illustrated in FIGS. 8a to 8d. In each diagram, the horizontal axis of the graph represents dose, and the vertical axis of the graph represents charge amount. Markers in the graph in each diagram represent the results obtained by evaluating writing, and solid lines represent calculated values from the function σ(d, $D_{exp}$). In FIGS. 8a to 8d, for each substrate, the charge amounts represented by the markers are plotted, as $D_{exp}$*p, using values obtained by evaluating writing described above while changing the pattern density p and the dose $D_{exp}$ to various values, $D_{exp}$*p being represented by the horizontal axis.

Rectangular markers represent charge amounts obtained immediately after writing has been performed, and triangle markers represent charge amounts obtained after attenuation has occurred. From these results, even when the film thickness or sensitivity of the resist is changed, if the physical characteristics of the resist do not change, it can be confirmed that charge amounts can be calculated with high accuracy using the function σ(d, $D_{exp}$) determined by the same group of parameters.

The resist is made of a base polymer and a small amount of a dissolution inhibitor and an acid generating agent, and the majority of the volume of the resist is occupied by the base polymer. Thus, it is considered that the physical characteristics of the resist described in the model according to the present embodiment and regarding charging at the time of beam irradiation are determined only by the characteristics of the polymer. Thus, the charge amounts for four kinds of substrates that are different in sensitivity can be calculated using the function determined by the same parameters for the four kinds of substrates. That is, in the present embodiment, for various substrates obtained by changing the film thickness of the resist or changing the sensitivity of the resist by changing the concentration of an additive such as the acid generating agent, unless a substantial change is made to the polymer composition such that the physical characteristics of the resist such as the secondary electron yield α, the permittivity ε, or the work function W are changed, charge amounts can be promptly and accurately calculated using the function σ(d, $D_{exp}$) using the same parameters for the various substrates.

The function σ(d, $D_{exp}$) and the group of parameters representing the physical characteristics of the resist formed in the substrate 2 are stored in advance in the storage device 21 of the writing apparatus 100 illustrated in FIG. 1.

Figure 9:
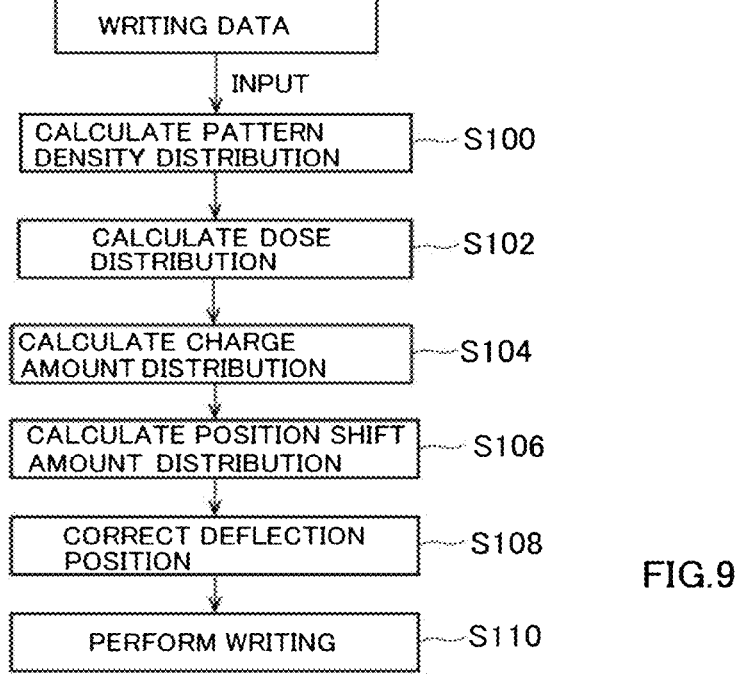
FIG. 9 is a flow chart for describing a writing method according to the present embodiment.

FIG. 9 is a flow chart for describing a writing method according to the present embodiment. This method has a pattern density distribution calculation step (step S100), a dose distribution calculation step (step S102), a charge amount distribution calculation step (step S104), a position shift amount distribution calculation step (step S106), a deflection position correction step (step S108), and a writing step (step S110).

In the pattern density distribution calculation step (step S100), the pattern density distribution calculation unit 32 reads out writing data from the storage device 140, virtually divides the writing region (or the frame regions) in a mesh-like manner so as to have predetermined dimensions (grid dimensions), and calculates, for each mesh region, a pattern density representing the arrangement ratio of a shape pattern defined in the writing data. For each mesh region, a pattern density distribution is then generated.

In the dose distribution calculation step (step S102), the dose distribution calculation unit 34 calculates, for each mesh region, the distribution of the dose $D_{exp}$ using the pattern density distribution. The dose $D_{exp}$ can be calculated using Eq. (1) described above.

In the charge amount distribution calculation step (step S104), the charge amount distribution calculation unit 36 reads out the function σ(d, $D_{exp}$) and the group of parameters from the storage device 21. For each mesh region, a charge amount distribution is calculated by substituting the film thickness d of the resist formed in the substrate 2 and the dose $D_{exp}$ calculated in step S102 into the function σ(d, $D_{exp}$) in which the group of parameters are set.

In the position shift amount distribution calculation step (step S106), the position shift amount distribution calculation unit 38 (a position shift amount arithmetic unit) calculates a position shift amount based on the charge amount distribution. Specifically, the position shift amount distribution calculation unit 38 calculates position shift amounts of writing positions due to the charge amounts at individual positions in the charge amount distribution by convolving the charge amount distribution calculated in step S104 with the response function r(x, y).

Suppose that the response function r(x, y) converts this charge amount distribution into a position shift amount distribution. In this case, a charge position represented by each position in the charge amount distribution is represented by (x', y'), and a beam irradiation position of a subject frame region on which data processing is currently performed is represented by (x, y). In this case, a beam position shift amount can be expressed as a function of the distance from a beam irradiation position (x, y) to a charge position (x', y'), and thus the response function can be described as r(x-x', y-y'). It is sufficient that the response function r(x-x', y-y') be obtained in advance so as to match results of experiments performed in advance or be obtained in advance through a numerical calculation. In the following, (x, y) represents a beam irradiation position of the subject frame region on which data processing is currently performed.

The position shift amount distribution calculation unit 38 then generates a position shift amount distribution from the position shift amount for each position (x, y) that is a writing target position in the subject frame region. The generated position shift amount distribution is stored in the storage device 21 and also output to the control calculator 120.

In contrast, in the control calculator 120, the shot data generation unit 41 reads out the writing data from the storage device 140 and generates shot data in a format unique to the writing apparatus 100 by performing multistage data conversion processing. The size of a shape pattern defined in the writing data is normally larger than the shot size that can be formed in one shot by the writing apparatus 100. Thus, in the writing apparatus 100, each shape pattern is divided into a plurality of shot shapes so as to have a size that can be formed in one shot by the writing apparatus 100 (shot division). For each shot shape, data such as a shape code representing a shape type, coordinates, and a size are defined as shot data.

In the deflection position correction step (step S108) (a position shift correction step), the position shift correction unit 42 corrects the irradiation position using the position shift amount calculated in step S106. In this case, the shot data for each position is corrected. Specifically, to the shot data for each position (x, y), a correction value for correcting the position shift amount represented by the position shift amount distribution is added. It is preferable that, for example, a value obtained by inverting the positive/negative sign of the position shift amount represented by the position shift amount distribution be used as the correction value. As a result, in a case where irradiation with the electron beam 6 is performed, the coordinates of the irradiation destination are corrected, and thus the deflection position to which the beam is deflected by the objective deflector 13 is corrected. Pieces of shot data are defined in a data file such that the pieces of shot data are sorted in shot order.

In the writing step (step S110), in shot order, the shaping deflector control unit 43 in the deflection control circuit 130 calculates, for each shot shape, the amount of deflection of the shaping deflector 10 for changing the shape of the electron beam 6, the amount of deflection being calculated from the shape type and size defined in the shot data. Moreover, the objective deflector control unit 44 calculates the amount of deflection of the objective deflector 13 for deflecting the shot shape to an irradiation position on the substrate 2. In other words, the objective deflector control unit 44 (a deflection amount arithmetic unit) calculates the amount of deflection for deflecting the electron beam to a corrected irradiation position. The objective deflector 13 arranged in the electronic lens barrel 1 then deflects the electron beam in accordance with the calculated amount of deflection to irradiate the corrected irradiation position with the electron beam. As a result, the writing unit W writes the pattern at a certain position on the substrate 2, the position being determined as a result of charge correction.

In the present embodiment, for substrates obtained by changing the film thickness of the resist or changing the sensitivity of the resist by changing the concentration of an additive such as the acid generating agent or a photodegradable base, unless the physical characteristics of the resist such as the secondary electron yield $\alpha$, the permittivity $\varepsilon$, or the work function W are changed, charge amounts can be promptly and accurately calculated using the same function $\sigma(d, D_{exp})$. As a result, the downtime of the apparatus needed for changing substrates can be reduced.

For example, in a case where substrates having different resist layers are intentionally used, it is sufficient that a post-change resist film thickness be substituted into the function $\sigma(d, D_{exp})$.

In a case where the resist film thicknesses of a plurality of substrates unintentionally vary, the resist film thicknesses are measured on a regular basis, the resist film thickness of the substrate that is currently used may be estimated on the basis of changes in the resist film thicknesses of the substrates that have been previously used, and the estimated value may be substituted into the function $\sigma(d, D_{exp})$.

In a case where the resist has an uneven distribution of film thicknesses within one substrate, the distribution of film thicknesses may be measured in advance, and the film thickness at the position for which the amount of charge is to be calculated may be substituted into the function $\sigma(d, D_{exp})$. The writing apparatus may be provided with a measurement device that measures the film thickness of the resist.

Irradiation position shifts due to charging phenomena do not happen only to electron beam writing apparatuses. The present invention can be applied to a charged particle beam apparatus that uses a result obtained by irradiating a target position with a charged particle beam, the charged particle beam apparatus being, for example, an inspection apparatus that inspects a pattern using a charged particle beam such as an electron beam.

In the above-described embodiment, in order to reduce the effect of fogging charging in which electrons scattered in the writing space fall down onto the substrate and to make direct charging by an electron beam with which irradiation is performed predominant, it is preferable that secondary electrons be prevented from returning to the surface of the substrate by applying a positive potential to the bottom surface of the objective lens 12 (an objective optical system).

Although the present invention has been described in detail by way of the specific modes, it is apparent for those skilled in the art that various changes can be made without departing from the spirit and scope of the present invention.

The present application is based on Japanese Patent Application No. 2020-78344 filed on Apr. 27, 2020, the entire contents of which are incorporated herein by reference.

REFERENCE SIGNS LIST 1 electronic lens barrel
2 substrate
3 XY stage
4 mirror
5 electron gun
6 electron beam
7 illumination lens
8 first aperture plate
9 projection lens
10 deflector
11 second aperture plate
12 objective lens
13 deflector
14 writing space
15 electrostatic lens
21, 140 storage device
30 writing control unit
32 pattern density distribution calculation unit
34 dose distribution calculation unit
36 charge amount distribution calculation unit
38 position shift amount distribution calculation unit
41 shot data generation unit
42 position shift correction unit
43 shaping deflector control unit 44 objective deflector control unit
45 stage position detection unit
46 stage control unit
100 writing apparatus

The invention claimed is:

1. A charged particle beam writing method in which a deflector is caused to deflect a charged particle beam and a pattern is written by irradiating, with the charged particle beam, a substrate on which a resist film is formed, the charged particle beam writing method comprising the steps of:

virtually dividing a writing region of the substrate in a mesh having grid dimensions and calculating a pattern density representing an arrangement ratio of the pattern for each of mesh region;

calculating a dose for each of the mesh region using the pattern density;

calculating a charge amount based on a film thickness of the resist film formed on the substrate and the calculated dose by using a predetermined function for charge amount calculation, the function using, as variables, the film thickness of the resist film and the dose and using, as parameters, a secondary electron yield, a permittivity, a resistivity during beam irradiation, a work function, and a positive-hole residual rate of resist;

calculating a position shift amount of a writing position from the calculated charge amount; and correcting an irradiation position of the charged particle beam using the position shift amount, wherein the function for charge amount calculation is independent of dose sensitivity of the resist film.

2. The charged particle beam writing method according to claim 1, characterized in that a charge amount is calculated based on a film thickness distribution of the resist film formed on the substrate and the function for charge amount calculation.

3. The charged particle beam writing method according to claim 1, characterized in that a resist film thickness measurement is performed on a regular basis, a resist film thickness of a writing target substrate is estimated based on a change in a resist film thickness of a substrate on which the pattern has been previously written, and a charge amount is calculated based on an estimated value of the resist film thickness and the function for charge amount calculation.

4. A charged particle beam writing apparatus in which a deflector is caused to deflect a charged particle beam and a pattern is written by irradiating, with the charged particle beam, a substrate on which a resist film is formed, the charged particle beam writing apparatus comprising:

an emitter emitting the charged particle beam;

a pattern density calculation circuit virtually dividing a writing region of the substrate in a mesh having grid dimensions and calculating a pattern density representing an arrangement ratio of the pattern for each mesh region;

a dose calculation circuit calculating a dose representing a dose for each mesh region using the pattern density;

a storage storing a function for charge amount calculation, the function using, as variables, a film thickness of the resist film and the dose;

a charge amount calculation circuit retrieving the function from the storage, using the function, and calculating a charge amount based on the film thickness of the resist film formed on the substrate and the dose calculated by the dose calculation circuit as variable, and based upon a secondary electron yield, a permittivity, a resistivity during beam irradiation, a work function, and a positive-hole residual rate of resist, as parameters;

a position shift amount calculation circuit calculating a position shift amount of a writing position from the charge amount;

a corrector correcting, using the position shift amount, an irradiation position of the charged particle beam; and a writer irradiating the corrected irradiation position with the charged particle beam, wherein the function for charge amount calculation is independent of a dose sensitivity of the resist film.

5. The charged particle beam writing apparatus according to claim 4, characterized in that the charge amount calculation circuit calculates a charge amount based on a film thickness distribution of the resist film formed on the substrate and the function for charge amount calculation.

6. The charged particle beam writing apparatus according to claim 4, characterized in that the charge amount calculation circuit estimates a resist film thickness of a writing target substrate based on a change in a resist film thickness of a substrate on which the pattern has been previously written, and calculates a charge amount based on an estimated value of the resist film thickness and the function for charge amount calculation.

\* \* \* \* \*